(12) United States Patent
Inniss et al.

(10) Patent No.: US 6,315,589 B1
(45) Date of Patent: Nov. 13, 2001

(54) CONNECTOR FOR COMBINED DC/DATA BUS

(75) Inventors: Brian Inniss, Dollard des Ormeaux; Michael Hutchins, Beaconsfield, both of (CA)

(73) Assignee: Astec International Limited (HK)

(*) Notice: Subject to any disclaimer, the term of this patent is extended or adjusted under 35 U.S.C. 154(b) by 0 days.

(21) Appl. No.: 09/586,679

(22) Filed: Jun. 1, 2000

(51) Int. Cl.$^7$ ................................................. H01R 4/60
(52) U.S. Cl. ..................... 439/212; 439/60; 439/924.1; 361/604
(58) Field of Search ........................ 439/207, 208, 439/209, 210, 211, 212, 213, 60, 924.1; 361/604, 775, 807, 809

(56) References Cited

U.S. PATENT DOCUMENTS

| | | | |
|---|---|---|---|
| 4,758,172 | * 7/1988 | Richards et al. | 439/212 |
| 4,872,212 | * 10/1989 | Roos et al. | 361/424 |
| 4,934,941 | * 6/1990 | Okada | 439/60 |
| 5,017,146 | * 5/1991 | Uechara et al. | 439/65 |
| 5,297,015 | 3/1994 | Miyazaki et al. | 363/146 |
| 5,365,424 | 11/1994 | Deam et al. | 363/144 |
| 5,394,296 | 2/1995 | Erickson, Jr. et al. | 361/659 |
| 5,421,751 | 6/1995 | Bennett et al. | 439/843 |
| 5,422,440 | 6/1995 | Palma | 174/133 B |
| 5,740,020 | * 4/1998 | Palatov | 361/796 |
| 5,745,338 | 4/1998 | Bartolo et al. | 361/637 |
| 5,764,502 | 6/1998 | Morgan et al. | 363/65 |
| 5,901,057 | 5/1999 | Brand et al. | 363/144 |
| 5,933,343 | 8/1999 | Lu et al. | 363/144 |
| 5,969,938 | 10/1999 | Byrne et al. | 361/678 |
| 5,969,965 | 10/1999 | Byrne et al. | 363/144 |
| 6,016,252 | 1/2000 | Pignolet et al. | 361/724 |

* cited by examiner

*Primary Examiner*—Paula Bradley
*Assistant Examiner*—Truc Nguyen
(74) *Attorney, Agent, or Firm*—Coudert Brothers

(57) ABSTRACT

A combination DC/data connector for connecting electrical equipment stacked in a rack to a continuous vertical combined DC/data bus includes a data connector which cooperates with a slot in the DC/data bus assembly to align the DC/data connector with the bus assembly and make contact with data buses on the walls of the slot. The DC/data connector also includes a pair of DC connectors which slide into channels in the DC bus bars of the DC/data bus assembly after the DC/data connector has been aligned with the bus assembly by the data connector. The data contacts of the DC/data connector are mounted on both sides of a printed circuit card which can be slid into the data connector, and which provides the interconnections between the data contacts and the equipment data interface.

11 Claims, 5 Drawing Sheets

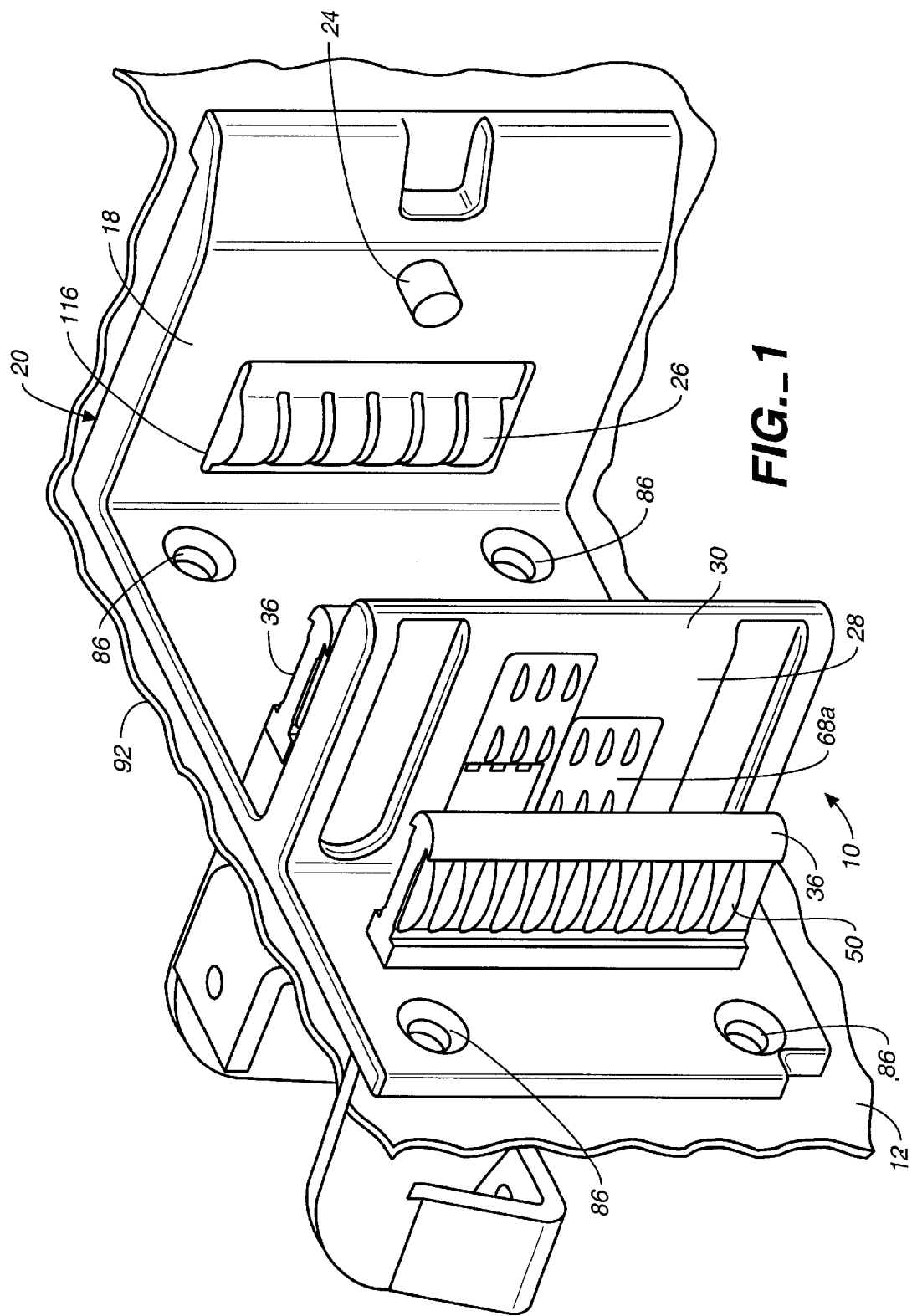
FIG._1

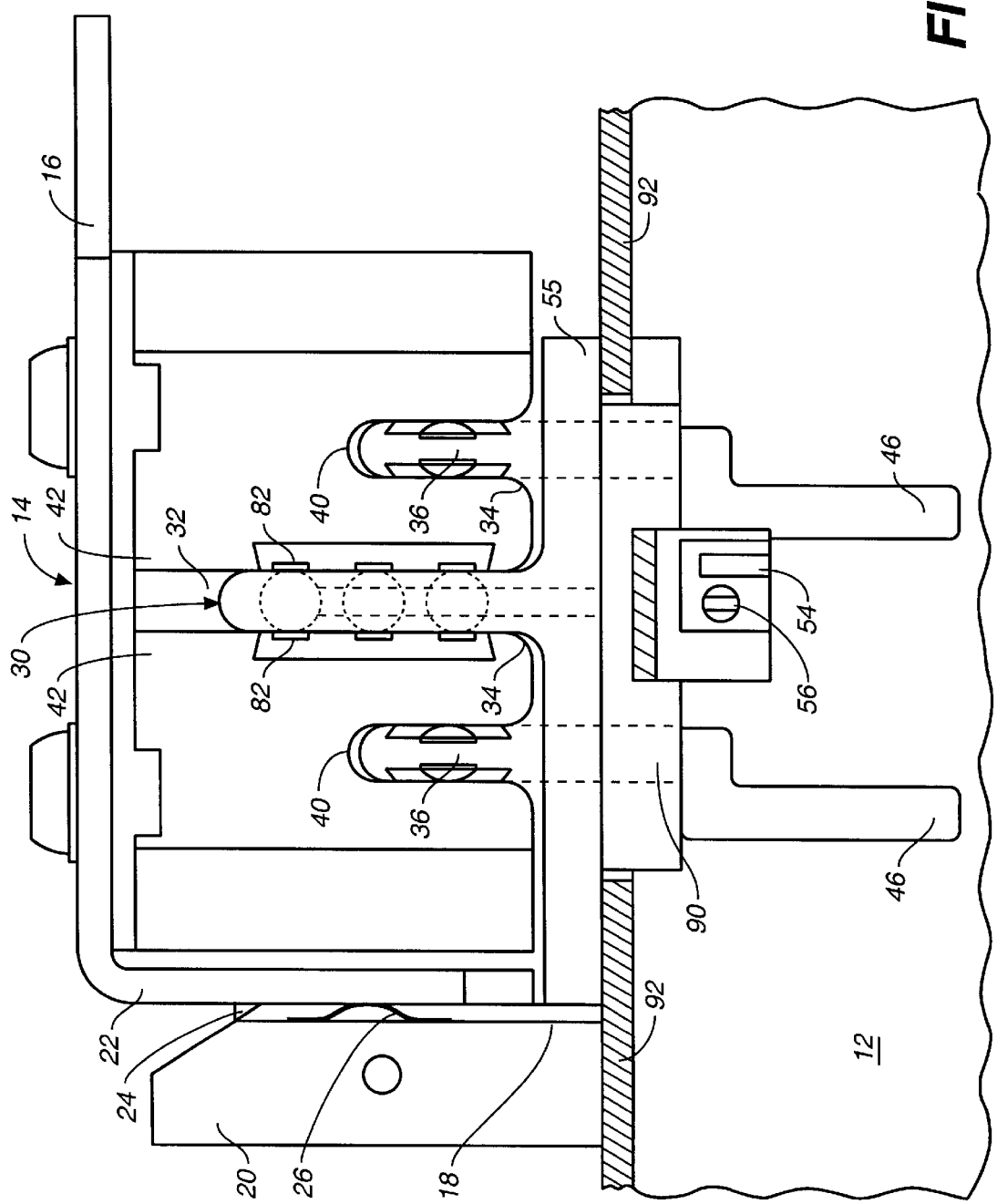
FIG._2

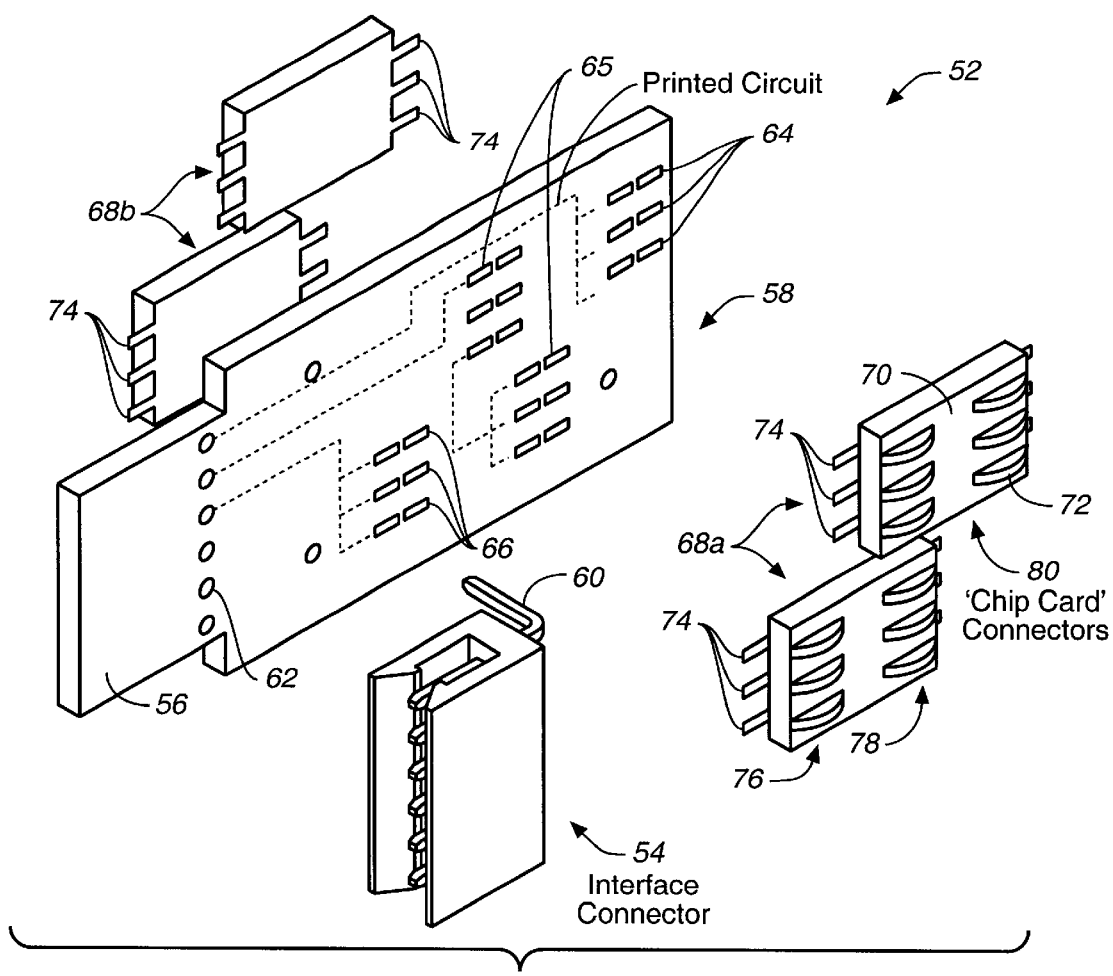
FIG._3
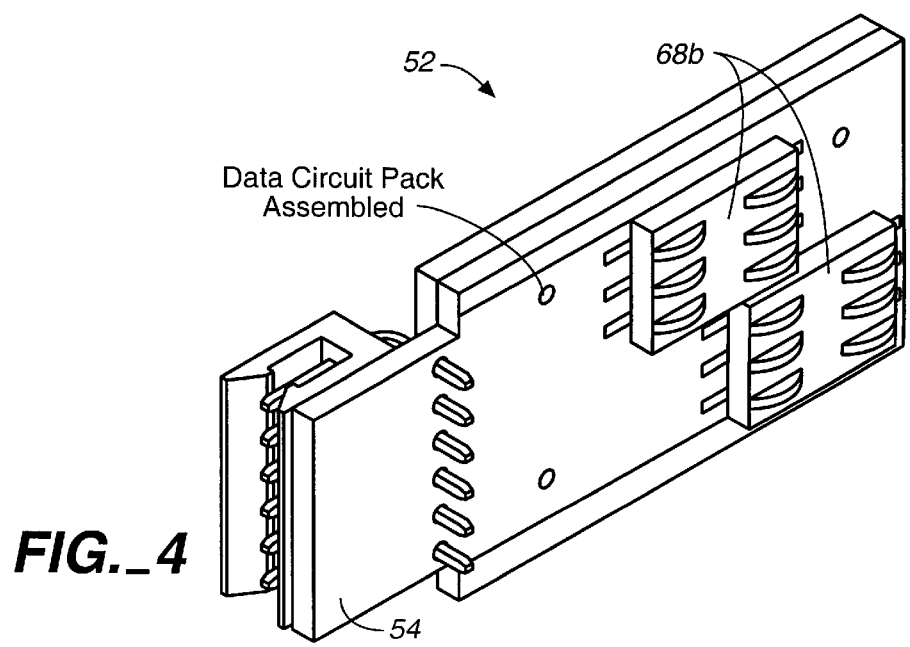
FIG._4

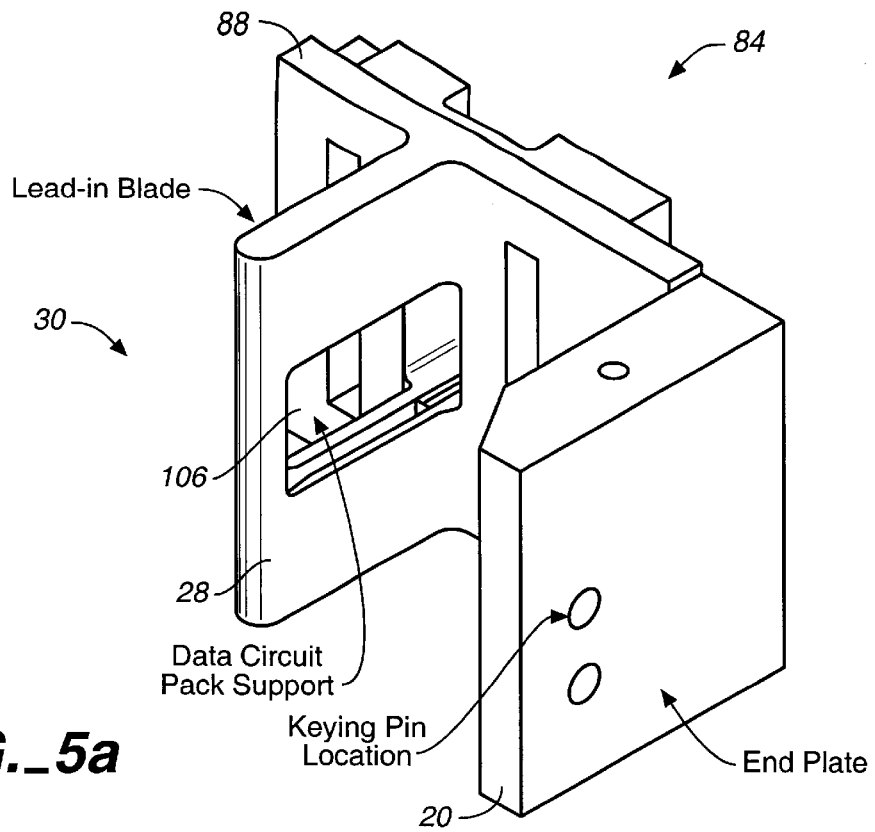
FIG._5a
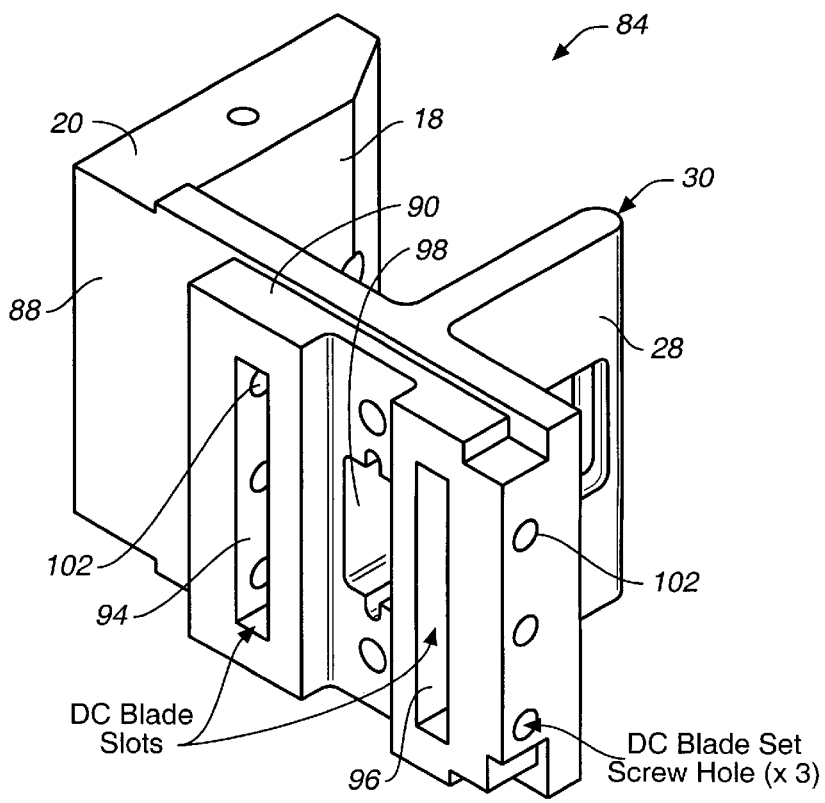
FIG._5b

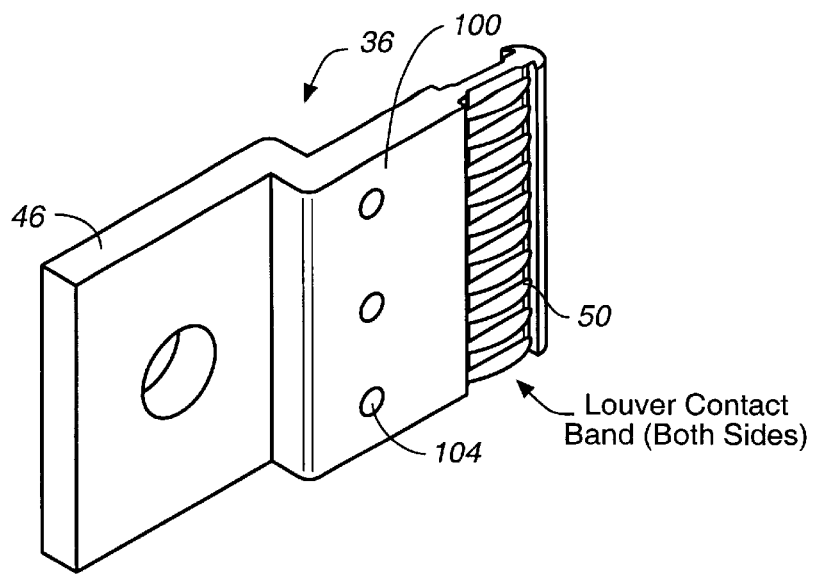
FIG._6
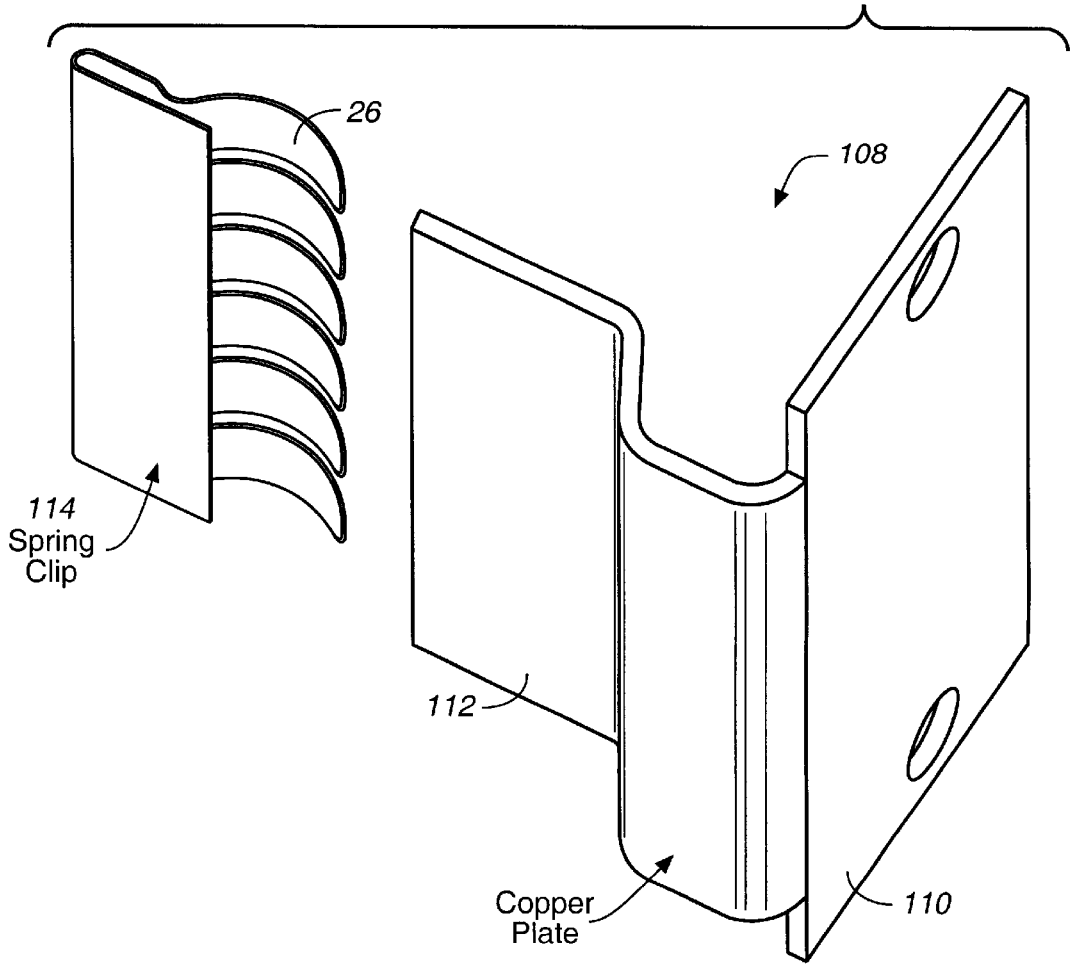
FIG._7

CONNECTOR FOR COMBINED DC/DATA BUS

FIELD OF THE INVENTION

This invention relates to connectors for plugging an electrical equipment chassis into a bus, and more specifically to a connector for connecting equipment to a combined DC power and data bus.

BACKGROUND OF THE INVENTION

Power supplies for providing DC power to large electronic installations such as mainframe computers conventionally consist of a number of individual power converters that are stacked one above the other on separate chassis in racks that may be enclosed in equipment cabinets. It is desirable for these racks to contain AC power lines and data and DC buses to which a converter or other electrical equipment may be connected merely by pushing its chassis into the rack. Because the converters used in a given installation would normally have the same shape and size horizontally but could be of varying heights, it is necessary for a bus system built into the rack to allow a converter to be plugged into it at substantially any vertical level. Prior art power system equipment bays have required that the location of each piece of plug-in equipment be predefined usually at the time of initial configuration of the system. Each piece of equipment must also be interconnected and traditionally this is done with a "power shelf" for the converter equipment, in which each power shelf supports three or four converters and a series of cables are used to interconnect multiple power shelves to a common distribution panel. Individual equipment not supported by power shelves must be interconnected using discrete cable assemblies.

Because of space and cost considerations, it is desirable to integrate the data bus with the DC bus, yet assure a reliable contact between the converter and the buses while preventing any possibility of short-circuiting the electronic circuitry during insertion or removal of an individual converter. A combined DC/data bus structure fulfilling these requirements is described in copending application Ser. No. 09/585,657 filed Jun. 1, 2000 and entitled Combined DC/Data Bus For Power Converter Racks. The connector that enables the power converter chassis to be plugged into this bus structure merely by pushing it into operating position in the rack is, however, not described and claimed in detail in the above-identified application.

SUMMARY OF THE INVENTION

The connector of this invention is designed to establish a DC power and data connection anywhere along a pair of parallel, vertically extending DC bus bars that define between them a vertically extending slot. Along the sides of the slot, insulating strips are inserted into the DC bus bars. These strips carry data bus bars on their outer faces. The inventive connector provides an elongated data connector which fits into the slot and carries the data contacts, and a pair of shorter male DC power connectors which plug into vertical female contact grooves in the front face of the DC bus bars. The data contacts are encased in an insulating shroud that guides the connector into alignment with the bus assembly and prevents the data contacts from coming into contact with the DC bus bars during insertion or removal. Also, the mutual spacing of the data contacts and data bus bars is such that the data contacts cannot accidentally bridge two adjacent data bus bars. All the contacts are resiliently biased to make secure contact with tile bus assembly, and the data contacts are mounted on a printed circuit card that provides an interface between the inventive connector assembly and an internal data connector associated with the equipment.

BRIEF DESCRIPTION OF THE DRAWINGS

FIG. 1 is a perspective view of the connector of this invention;

FIG. 2 is a horizontal section of the inventive connector and of the bus assembly when they are mated;

FIG. 3 is an exploded perspective view of the data contact assembly of the inventive connector;

FIG. 4 is an assembled perspective view of the data contact assembly, inverted from FIG. 3 to show its other side;

FIGS. 5a and 5b are rear and front perspective views, respectively, of the connector's insulating housing;

FIG. 6 is a perspective view of a DC blade; and

FIG. 7 is an exploded perspective view of the EMI ground plate.

DESCRIPTION OF THE PREFERRED EMBODIMENT

FIG. 1 shows the connector assembly 10 mounted on the chassis 12 of a piece of equipment such as a power converter (not shown) that interacts with the bus assembly 14 (FIG. 2) to form a plug-in interconnection between the power converter and the bus assembly 14. The details of the bus assembly 14 are shown and described in the aforesaid copending application Ser. No. 09/585,657, which is incorporated herein by reference. As shown in FIG. 2, when the power converter is pushed toward the bus assembly 14 as it is installed in the equipment rack 16, the surface 18 of the insulating end plate 20 comes to lie against the outside of the flange 22 of rack member 16. In that position, pin 24 (best seen in FIG. 1) engages a notch (not shown) of the flange 22 to hold the power converter chassis 12 against vertical movement. Also, in that position, the resilient wipers 26 electrically connected to the chassis 12 make contact with the flange 22 to ground the power converter chassis 12 to the rack member 16.

As the connector assembly 10 and the chassis 12 to which it is attached are pushed rearwardly against the bus assembly 14, the insulating sheath 28 of the data connector 30 first enters the slot 32 and, guided by the beveled surfaces 34, aligns the connector assembly 10 so that its male DC connectors 36 will subsequently accurately enter the female contact channels 40 of the DC bus bars 42. The DC connectors 36 are connected to the DC output of the converter inside the chassis 12 by appropriate equipment connection plates 46. The DC connectors 36 carry on their sides DC contacts using louvered resilient wipers 50 to assure a good contact with the channels 40 of the DC bus bars 42.

The insulating sheath 28 of the data connector 30 encloses a data contact assembly 52. Assembly 52 is best shown in exploded form in FIG. 3 and in assembled form in FIG. 4. The interface connector 54 protrudes into the interior of the power converter chassis 12 for conventional connection to the equipment's circuitry (not shown). The interface connector 54 is mounted on the inner end 56 of printed circuit card 58 by way of solder pins 60 which fit into the via 62. In the interior (not shown) of the printed circuit card 58, the top via 62 is preferably electrically connected, as shown by dotted lines in FIG. 3, to solder pads 64. Similarly, the next via 62 is electrically connected to solder pads 65, and the next via 62 is electrically connected to solder pads 66. The bottom three vias have similar connections (not shown) to solder pads on the other side of the printed circuit card 58 that connect to chip card connectors 68b. The chip card connectors 68a, 68b are soldered to solder pads 64–66. The chip card connectors 68a, 68b consist of an insulating body 70 which carries resilient wiper contacts 72. The contacts 72 are electrically connected to terminals 74 soldered to the solder pads 64–66. When assembled as shown in FIGS. 3 and 4, the wiper contacts 72 preferably form three rows 76, 78, 80 whose positions relative to each other correspond to the relative positions of data buses 82 in FIG. 2.

The data contact assembly 52 is inserted, as best shown in FIG. 1, into the sheath 28. As seen in FIG. 2, as the data connector 30 is pushed into the slot 32, the data contact wipers 72 wipe over the data bus bars 82 and make contact therewith. The relative spacing of the rows 76, 78, 80 and of the data buses 82 is such that the wipers 72 cannot contact more than one data bus at any time during the insertion of the connector 10 into, or its withdrawal from, the bus assembly 14.

The specific structure of the connector 10 is illustrated in more detail in FIGS. 5a, 5b, 6 and 7. FIGS. 5a and 5b show the front and rear, respectively, of the moulded plastic housing 84 that carries the contact assemblies of the connector 10 in mutually insulated relationship. The housing 84 is secured to the rear face of chassis 12 by screws 86 (FIG. 1). The end plate 20, main plate 88 and the insulating sheath 28 of the data connector 30 protrude rearwardly to the outside of the chassis 12, while the blade receiver 90 protrudes inwardly of the chassis 12 through an opening formed in the rear wall 92 of chassis 12 (FIG. 2). Slots 94, 96 and 98 are defined in blade receiver 90 of housing 84 and thus form insulated conduits through the rear wall of the chassis 12.

DC slots 94 and 96 of housing 84 receive the DC connectors 36, one of which is depicted in more detail in FIG. 6. Each of the DC connectors 36 has a blade portion 100 and an equipment connection plate portion 46. The DC connectors 36 are inserted through the slots 94 and 96, and are secured therein by setscrews 102 engaging corresponding openings 104 in the DC connectors 36. The blade portion 100 of the DC connectors 36 carries, on both sides, louvered contact bands or wipers 50 to provide compliant spring contact with the surfaces of channels 40 formed in the DC bus bars 42, so as to assure good high-current contact therewith.

The data slot 98 slidingly receives therein the assembly 52 of FIG. 4. When the assembly 52 is fully slid into the slot 98 the data contacts 72 Will protrude laterally through the window 106 in the insulating sheath 28 so as to contact the data buses in the slot 32 of the bus assembly 14 (FIG. 2).

The insulating end plate 20 of housing 84 contains within it a hardened copper ground plate 108 shown in FIG. 7. The base portion 110 of ground plate 108 is secured and electrically connected to the metal chassis 12. The flange portion 112 extends rearwardly within the end plate 20 and carries a spring clip 114 that supports contact wipers 26 which protrude through an opening 116 in the face 18 of end plate 20. The wipers 26 make grounding contact with the flange 22 when the connector 10 and the bus assembly 14 are mated.

Although preferred and alternative embodiments of the present invention and modifications thereof have been described in detail herein, it is to be understood that this invention is not limited to those precise embodiments and modifications, and that other modifications and variations may be created by one of ordinary skill in the art without departing from the spirit and scope of the invention as defined in the appended claims.

What is claimed is:

1. A combination DC and data connector mounted on an electrical equipment chassis, said connector connecting said equipment to a combination DC/data bus assembly when said chassis is mounted in a rack and pushed against said bus assembly, said DC/data bus assembly including a pair of parallel DC bus bars, said DC bus bars having channels formed therein, defining a slot between them, and carrying data buses on walls of said slot, said DC and data connector comprising:

a) an insulated housing mounted on the chassis;
   b) a data connector mounted on said insulated housing and extending outwardly therefrom, said data connector being adapted to engage said slot to align said DC and data connector with said DC/data bus assembly, said data connector including an insulated sheath and data contacts protruding laterally from said sheath, said data contacts being adapted to engage said data buses; and
   c) a pair of DC connectors mounted on said insulated housing and extending outwardly therefrom on opposite sides of said data connector a shorter distance than said data connector so as to engage said channels after said data connector has engaged said slot.

2. The connector of claim 1, wherein said insulated housing further comprises an end plate insulated from said DC connectors and extending outwardly from said chassis, said end plate including a ground plate electrically connected to said chassis, said ground plate carrying ground contacts adapted to engage said rack.

3. The connector of claim 1, in which said DC connectors carry DC contacts, and said data contacts and DC contacts are in the form of resilient wipers.

4. The connector of claim 1, in which said data contacts are mounted on a printed circuit card which can be slid into said insulating sheath, and which connects said data contacts to a data interface within said equipment.

5. The connector of claim 4, further comprising an insulating housing mounted on said chassis and having portions extending through said chassis, said housing having passages formed therein, said passages extending through said chassis in insulated relationship thereto, and said DC connectors and circuit card extending through said chassis in said passages.

6. The connector of claim 4 in which said data contacts are arranged such that none of them can bridge adjacent data bars.

7. The connector of claim 2, in which said round contacts are resilient wipers.

8. The assembly of claim 1, in which each of said DC bus bars has a substantially continuous channel formed in said front face, said channel being adapted to receive a DC connector therein.

9. A connector assembly for connecting a chassis containing electrical equipment to a combination DC and data bus when said chassis is horizontally placed into operating position in an equipment stack, said DC and data bus comprising a pair of elongated DC bus bars disposed vertically adjacent said equipment stack, said DC bus bars each having a front face, a rear face, and a side face facing a side face of the other of said DC bus bars, said side faces defining a slot between them, a plurality of vertically extending data bus bars insulated from said DC bus bars and positioned on said side faces in said slot, each of said DC bus bars having a substantially continuous channel formed in said front face, said connector assembly further comprising:

a) an insulated housing mounted on said chassis;

b) an insulated data connector mounted on said insulated housing and extending outwardly therefrom, said data connector being adapted to engage said slot to align said connector assembly with said DC and data bus, said data connector including data contacts protruding laterally from said data connector, each data contact electrically connected to said chassis equipment, said data contacts being adapted to engage said data bus bars as said chassis is placed into operating position in said stack;

c) a pair of DC connectors mounted on said insulated housing and extending outwardly therefrom on opposite sides of said data connector a shorter distance than said data connector so as to engage said channels after said data connector has engaged said slot.

10. The system of claim 9, in which said data contact assembly includes a plurality of data contacts so mutually arranged that none of them can bridge a plurality of said data bus bars while said data contact assembly is engaging said slot.

11. The connector assembly of claim 9, wherein said DC and data bus includes a flange having a plurality of notches formed therein disposed vertically adjacent to said DC bus bars, and wherein said insulated housing further comprises an end plate insulated from said DC connectors and extending outwardly from said chassis, said end plate including a pin positioned to engage one of said notches in said flange when said chassis is engaged in operative position in said stack to hold said chassis against vertical movement in said stack.

\* \* \* \* \*